United States Patent

Nishimura

(10) Patent No.: US 9,881,861 B2
(45) Date of Patent: Jan. 30, 2018

(54) WIRING SUBSTRATE

(71) Applicant: NGK SPARK PLUG CO., LTD., Nagoya-shi, Aichi (JP)

(72) Inventor: Sadahiro Nishimura, Ichinomiya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/312,709

(22) PCT Filed: May 27, 2015

(86) PCT No.: PCT/JP2015/065316
§ 371 (c)(1),
(2) Date: Nov. 21, 2016

(87) PCT Pub. No.: WO2015/182678
PCT Pub. Date: Dec. 3, 2015

(65) Prior Publication Data
US 2017/0186680 A1    Jun. 29, 2017

(30) Foreign Application Priority Data

May 28, 2014 (JP) ................................ 2014-110252

(51) Int. Cl.
*H05K 1/11* (2006.01)
*H01L 23/498* (2006.01)
(Continued)

(52) U.S. Cl.
CPC .... *H01L 23/49838* (2013.01); *H01L 21/4846* (2013.01); *H01L 23/49827* (2013.01);
(Continued)

(58) Field of Classification Search
CPC .. H05K 1/00; H05K 1/11; H01L 21/02; H01L 21/48; H01L 21/60; H01L 23/02;
(Continued)

(56) References Cited

U.S. PATENT DOCUMENTS 3,788,722 A * 1/1974 Milgram ................. H01J 17/49
445/25
4,171,502 A * 10/1979 Milgram ............... H01J 17/491
313/517
(Continued)

FOREIGN PATENT DOCUMENTS

JP        H07-202074 A    8/1995
JP        2002-26189 A    1/2002
(Continued)

OTHER PUBLICATIONS

Japan Patent Office, International Search Report issued in International Stage of subject Application No. PCT/JP2015/065316, dated Jul. 28, 2015.

*Primary Examiner* — Xiaoliang Chen
(74) *Attorney, Agent, or Firm* — Stites & Harbison, PLLC; Jeffrey A. Haeberlin

(57) ABSTRACT

A Wiring substrate includes a substrate body that is formed from ceramics, and that includes a front surface, a back surface, and side surfaces positioned between peripheral sides of the front surface and the back surface; a frame-shaped metalized layer (surface conductor portion) that is formed on the front surface of the substrate body, a surface of the frame-shaped metalized layer being covered with a metal plating film; and an electroplating conductor layer that is formed in the substrate body, an end of the electroplating conductor layer being electrically connected to the frame-shaped metalized layer, the other end of the electroplating conductor layer being formed at the front surface of the substrate body, the other end of the electroplating conductor layer being electrically independent of different conductor portions that differ from frame-shaped metalized layer, the electroplating conductor layer being separated from the side surfaces of the substrate body. An opening portion for
(Continued)

exposing at least a portion of the electroplating conductor layer at a bottom surface is formed in the front surface of the substrate body.

7 Claims, 3 Drawing Sheets

(51) Int. Cl.
*H01L 21/48* (2006.01)
*H01L 23/00* (2006.01)
(52) U.S. Cl.
CPC ........ *H01L 23/49894* (2013.01); *H01L 24/32* (2013.01); *H01L 24/48* (2013.01); *H01L 24/73* (2013.01); *H01L 2224/32227* (2013.01); *H01L 2224/48091* (2013.01); *H01L 2224/48106* (2013.01); *H01L 2224/48227* (2013.01); *H01L 2224/73265* (2013.01); *H01L 2924/01028* (2013.01); *H01L 2924/01079* (2013.01); *H01L 2924/059* (2013.01); *H01L 2924/05042* (2013.01); *H01L 2924/05432* (2013.01); *H01L 2924/15153* (2013.01); *H01L 2924/15738* (2013.01); *H01L 2924/15787* (2013.01)
(58) Field of Classification Search
CPC ......... H01L 23/10; H01L 23/12; H01L 23/13; H01L 23/14; H01L 23/15; H01L 23/48; H01L 23/52; H01L 23/57; H01L 41/04; H01L 41/53
USPC ........ 174/262, 261, 551, 559, 565; 257/664, 257/700–702, 709–711, 737, 738, 780; 310/320, 344, 346, 348
See application file for complete search history.

(56) References Cited

U.S. PATENT DOCUMENTS

| | | | | |
|---|---|---|---|---|
| 4,839,717 | A | * | 6/1989 | Phy ........................ H01L 23/057 257/664 |
| 4,992,628 | A | * | 2/1991 | Beppu ................... H01L 23/057 174/530 |
| 5,185,550 | A | * | 2/1993 | Morita ...................... H03H 3/02 310/344 |
| 5,394,011 | A | * | 2/1995 | Yamamoto .............. H01L 23/10 257/693 |
| 5,877,551 | A | * | 3/1999 | Tostado .............. H01L 21/4846 257/701 |
| 8,791,766 | B2 | * | 7/2014 | Ishii ..................... H03H 9/0542 310/346 |
| 8,970,316 | B2 | * | 3/2015 | Ishii ..................... H03H 9/0542 310/344 |
| 9,048,810 | B2 | * | 6/2015 | Ishii ..................... H03H 9/0542 310/320 |
| 2003/0146677 | A1 | * | 8/2003 | Baba ................... H01L 23/3121 310/348 |
| 2014/0353024 | A1 | * | 12/2014 | Matsuhashi .......... H05K 3/0097 174/261 |

FOREIGN PATENT DOCUMENTS

JP 2003-0168754 A 6/2003
JP 2007-251017 A 9/2007

\* cited by examiner

WIRING SUBSTRATE

TECHNICAL FIELD

The present invention relates to a wiring substrate in which, even if, for example, a surface of a ceramic substrate body is provided with, for example, a non-conducting surface conductor portion that is not electrically connected to an external connection conductor, a surface of, for example, the surface conductor portion is reliably covered with an electrolytic metal plating film.

BACKGROUND ART

For example, an invention pertaining to a method for producing a semiconductor-device accommodating package that is described below is proposed (refer to, for example, Patent Literature 1). In the method, at least one of a single long pad that has been short-circuited in its entirety or a plurality of pads is/are formed at a side surface of an insulating body. In the method, by bringing a plurality of external lead terminals provided vertically from the same frame member into contact with either the pad or the pads, surfaces of a plurality of wiring metallized layers can be covered with metal plating films by electroplating, the wiring metallized layers being provided at the side of a bottom surface of a cavity that opens at a surface of the insulating body and being individually electrically connected to the pad or the pads.

However, in the case of the semiconductor-device accommodating package having the above-described structure, after the plating, the unnecessary plurality of pads that are formed on the side surface of the insulating body need to be ground and removed. However, end surfaces of respective internal wirings are exposed at the side surface of the insulating body after the pads have been removed. This may cause, for example, electrically unintentional short circuits to occur.

On the other hand, when there are metalized layers which are formed on a surface of a ceramic substrate body, which have the shape of a rectangular frame in plan view, which have a relatively small width, and which are used for sealing a cavity, and a non-conducting pad in which electric current does not flow among relatively small pads that are provided at the surface of the base body or at the side of the bottom surface of the cavity that opens at the surface of the base body, Ni plating films and Au plating films are successively applied to the surfaces of the metalized layers and the surface of the non-conducting pad by electroplating while an electrode pin, which is pointed at one end, point-contacts the surfaces of the metalized layers and the surface of the non-conducting pad.

However, when the electrode pin is brought into point-contact or a peripheral surface of the electrode pin is brought into line-contact with the surfaces of the metallized layers and the surface of the pad, the surfaces of the metallized layers and the surface of the pad are scratched when portions of contact are unintentionally shifted. Moreover, when the width of the metalized layers is small and the non-conducting pad is small, if the electrode pin is dislodged, electroplating sometimes can no longer be performed. Further, when an electrode conductor portion for contact with the electrode pin separately protrudes from the surface of the substrate body at the outer side of the metalized layers, the size of the substrate body is increased.

CITATION LIST

Patent Literature

PTL 1: Japanese Unexamined Patent Application Publication No. 2003-168754 (pages 1 to 7, FIGS. 1 to 5)

SUMMARY OF INVENTION

Technical Problem

It is an object of the prevent invention to provide a wiring substrate that can solve the problems described in the background art, and in which, even if, for example, a surface of a ceramic substrate body is provided with a surface conductor portion that is not electrically connected to an external connection conductor, and a bottom-surface side of a cavity that opens at the surface of the substrate body is provided with a surface conductor portion that is not electrically connected to an external connection conductor, these surfaces are reliably covered with metal plating films by electroplating, scratches on such surfaces caused by contact with an electrode pin are less likely to be conspicuous, and the substrate body can be reduced in size.

Solution to Problem and Advantageous Effects of Invention

To this end, the present invention is achieved based on the idea of forming an opening portion in which an electrode pin can be inserted in at least one of a front surface or a back surface of a ceramic substrate body, and causing an electroplating conductor layer whose one portion is exposed at a bottom surface defining the opening portion and a surface conductor portion that needs to be covered with a metal plating film to be capable of being electrically conductive with each other.

That is, a first wiring substrate according to the present invention (Claim 1) includes a substrate body that is formed from ceramic, and that includes a front surface, a back surface, and side surfaces positioned between the front surface and the back surface; a surface conductor portion that is formed on at least one of the front surface or the back surface of the substrate body, a surface of the surface conductor portion being covered with a metal plating film; and an electroplating conductor layer that is formed in the substrate body, an end of the electroplating conductor layer being electrically connected to the surface conductor portion, the other end of the electroplating conductor layer being formed at the front surface or the back surface of the substrate body, the other end of the electroplating conductor layer being electrically independent of a different conductor portion that differs from the surface conductor portion, the electroplating conductor layer being separated from the side surfaces of the substrate body. An opening portion for exposing at least a portion of the electroplating conductor layer is formed in at least one of the front surface or the back surface of the substrate body.

In the foregoing description, the phrase "an electroplating conductor layer that is formed in the substrate body, an end of the electroplating conductor layer being electrically connected to the surface conductor portion, the other end of the electroplating conductor layer being formed at the front surface or the back surface of the substrate body, the other end of the electroplating conductor layer being electrically independent of a different conductor portion that differs from the surface conductor portion, the electroplating conductor layer being separated from the side surfaces of the substrate body" may also be expressed by the phrase "an electroplating conductor layer that is formed in the substrate body, an end of the electroplating conductor layer being electrically connected to the surface conductor portion, the other end of the electroplating conductor layer being formed at the front surface or the back surface of the substrate body, the other end of the electroplating conductor layer being electrically independent of a different conductor portion that differs from the surface conductor portion, the electroplating conductor layer not being exposed at the side surfaces of the substrate body".

According to this structure, the surface conductor portion is electrically connected to the end portion of the electroplating conductor layer having the portion that is exposed at the opening portion formed in at least one of the front surface or the back surface of the substrate body. Therefore, even if, for example, the front surface of the substrate body is largely occupied by a different conductor portion, the surface conductor portion can be electrically conductive with the electroplating conductor layer through, for example, a via conductor. Therefore, by inserting an end portion of an electrode pin, which is used for electroplating, from the opening portion, and by bringing the end portion of the electrode pin into contact with the portion of the electroplating conductor layer that is exposed at the opening portion, the surface of the surface conductor portion is reliably covered with a metal plating film, such as an Ni plating film or an Au plating film. Consequently, the Wiring substrate is one in which the surface of the surface conductor portion that is electrically independent of a different conductor layer, such as an external connection conductor, when in use is reliably covered with a metal plating film.

Moreover, since the portion of the electroplating conductor layer is exposed at the opening portion, it is less likely for the end portion of the electrode pin, used for electroplating, that is inserted in the opening portion to be shifted and dislodged from the opening portion; and, even if scratches, such as indentations, are produced by the pin, since such scratches are positioned at the side of the bottom surface defining the opening portion, these scratches are less likely to be conspicuous. Further, since the electroplating conductor layer is formed in the substrate body and the portion thereof is exposed at the opening portion, it is possible to prevent unintentional short circuits, which occurred in the past, from occurring, and to easily reduce the size of the substrate body.

The word "ceramic" refers to high-temperature fired ceramic, such as alumina, mullite, and aluminum nitride, and low-temperature fired ceramic, such as glass-ceramic.

In addition to having the shape of a plate having a flat surface, the substrate body may have a cavity that opens at the front surface towards the center of the surface.

Further, when in use, the surface conductor portion is a non-conducting conductor portion that is electrically independent of a different conductor layer, such as an external connection conductor, that is electrically connected to a terminal formed on a mother board. Examples of the surface conductor portion include a frame-shaped metalized layer (cavity sealing metalized layer) for mounting a metallic cover plate or a metallic frame member for sealing a cavity, and a non-conducting external connection terminal that is electrically independent of a different conductor layer. In contrast, when in use, the different conductor portion is a conductor portion that is electrically connected to the terminal of the mother board.

For the surface conductor portion, the electroplating conductor layer, a via conductor, wiring layers which are conductor portions different from the surface conductor portion, and a connection wiring, the following materials are used. For example, W, Mo, or an alloy based on either one of W and Mo is used when the ceramic of the substrate body is a high-temperature fired ceramic; and, for example, Ag or Cu is used when the ceramic of the substrate body is a low-temperature fired ceramic.

a pointed end portion of a power-feeding pin for feeding electric current for electroplating to the surface of the surface conductor portion point-contacts the portion of the electroplating conductor layer that is exposed at a bottom surface defining the opening portion (exposed surface).

Further, the opening portion is formed so as to extend in a thickness direction through an outermost ceramic layer that forms the front surface or the back surface of the substrate body or the ceramic layer and a ceramic that is adjacent to the ceramic layer.

In addition, examples of the metal plating film include an Ni plating film and an Au plating film.

According to the Wiring substrate of the present invention (Claim 2), the surface conductor portion may be a frame-shaped metalized layer for sealing a cavity that opens at the front surface of the substrate body, the frame-shaped metalized layer being formed along an opening portion of the cavity, or may be a portion of an external connection conductor that is formed on the front surface or the back surface of the substrate body.

According to this structure, even if the width of the frame-shaped metalized layer is relatively small, and the area of the external connection conductor that is non-conducting when in use is relatively small, it is possible to provide a Wiring substrate in which the surfaces thereof are reliably covered with required metal plating films through the electroplating conductor layer and a conductor portion that is electrically conductive with the electroplating conductor layer.

The external connection conductor is one in which electric current does not flow when in use. For example, the external connection conductor is used as a dummy pad that forms part of a pattern used in image processing, a dummy element mounting pad for stabilizing the orientation of an element to be mounted, or an alignment mark for positioning the Wiring substrate.

Further, according to the Wiring substrate of the present invention (Claim 3), the substrate body may have a cavity that opens at the front surface thereof, and a non-conducting pad may be formed at a bottom-surface side of the cavity, the non-conducting pad being the surface conductor portion.

According to this structure, even if the non-conducting (dummy) pad is relatively small, for example, even if the area of the non-conducting pad is relatively smaller than the area of the element mounting pad for mounting, for example, an electronic component to be mounted, it is possible to provide a Wiring substrate in which a surface thereof is reliably covered with a required metal plating film through the electroplating conductor and a conductor that is electrically conductive therewith.

The bottom-surface side of the cavity refers to, in addition to the bottom surface defining the cavity, a horizontal surface of a stepped portion that is located relatively close to the periphery of the bottom surface.

A single element mounting pad for mounting, for example, an electronic component to be mounted in the cavity is formed at the central portion of the bottom surface defining the cavity. When the surface area of the mounting pad is relatively wide, the mounting pad is not regarded as the surface conductor portion according to the present invention. However, when a plurality of element mounting pads are provided and when one or more of the plurality of element mounting pads are non-conducting (dummy) element mounting pads, the non-conducting element mounting pad or pads are regarded as the surface conductor portion.

According to the Wiring substrate of the present invention (Claim 4), the surface conductor portion and the electroplating conductor layer are capable of being electrically conductive with each other through at least one of a via conductor or a connection wiring.

According to this structure, in the thickness direction of the front and back surface of the substrate body or in the direction along the front and back surface, separation of the surface conductor portion and the electroplating conductor layer according to arrangement positions thereof is reliably prevented, so that they can be electrically connected to each other. Therefore, it is possible to reliably cover the surface of the surface conductor portion with the metal plating film.

The surface conductor portion and the electroplating conductor layer may be capable of being electrically conductive with each other through one via conductor or a plurality of the via conductors and one connection wiring (wiring layer) or a plurality of the connection wirings formed in the substrate body, on the front surface of the substrate body, or on the back surface of the substrate body.

According to the Wiring substrate of the present invention (Claim 5), the opening portion may be a bottomed hole, and a portion of the electroplating conductor layer is exposed at a bottom surface defining the bottomed hole.

According to this structure, it is possible to insert an end portion of an electrode pin, which is used for electroplating, from the opening portion, and to easily bring the end portion of the electrode pin into contact with the portion of the electroplating conductor layer (plating surface electrode) that is exposed at the bottom surface defining the bottomed hole. In addition, even if the electrode pin is shifted in a radial direction of the bottomed hole, the state of contact between the end portion and the exposed surface of the electroplating conductor layer is easily maintained. Therefore, a Wiring substrate in which the surface of the surface conductor portion is reliably covered with a required metal plating film is provided.

Examples of the shapes of the bottomed hole that becomes the opening portion include a circular shape in plan view and a circular cylindrical shape as a whole; an elliptical shape in plan view and an elliptical cylindrical shape as a whole; an oblong shape in plan view and a long circular cylindrical shape as a whole; an inverted conical shape, an inverted elliptical conical shape, and an inverted long conical shape in which the bottom-surface side of the bottomed hole is narrow; and a polygonal shape having three or more sides in plan view and the shape of a polygonal prism that is at least a triangular prism as a whole. The portion, which is flat, of the electroplating conductor portion is exposed at the bottom surface defining the bottomed hole having any of the shapes mentioned above.

According to the Wiring substrate of the present invention (Claim 6), a wall surface conductor layer that is electrically connected to the electroplating conductor layer may be formed at an inner wall surface defining the bottomed hole.

According to this structure, even if, for example, an electrode pin is shifted in the radial direction of the bottomed hole by an external force that is unintentionally applied, since the end portion reliably contacts the wall-surface conductor layer, it is possible to provide a Wiring substrate in which the surface of the surface conductor portion is reliably covered with a required metal plating film.

According to the Wiring substrate of the present invention (Claim 7), the surface conductor portion and the electroplating conductor layer may be electrically connected to each other through the wall surface conductor layer and the connection wiring formed on the front surface or the back surface of the substrate body.

According to this structure, for example, at the front surface or the back surface of the substrate body, the surface conductor portion and the electroplating conductor layer can be electrically conductive with each other through the connection wiring having a relatively small width and the wall surface conductor layer formed on the inner wall surface defining the bottomed hole. Therefore, by forming the connection wiring at any location on the back surface or between other conductors at the front surface or the back surface of the substrate body, it is possible to minimize the volume (region) of the inside of the substrate body that is occupied to provide a Wiring substrate in which the surface of the surface conductor portion is reliably covered with a required metal plating film.

DESCRIPTION OF EMBODIMENTS

Embodiments for carrying out the invention are hereunder described.

Figure 1:
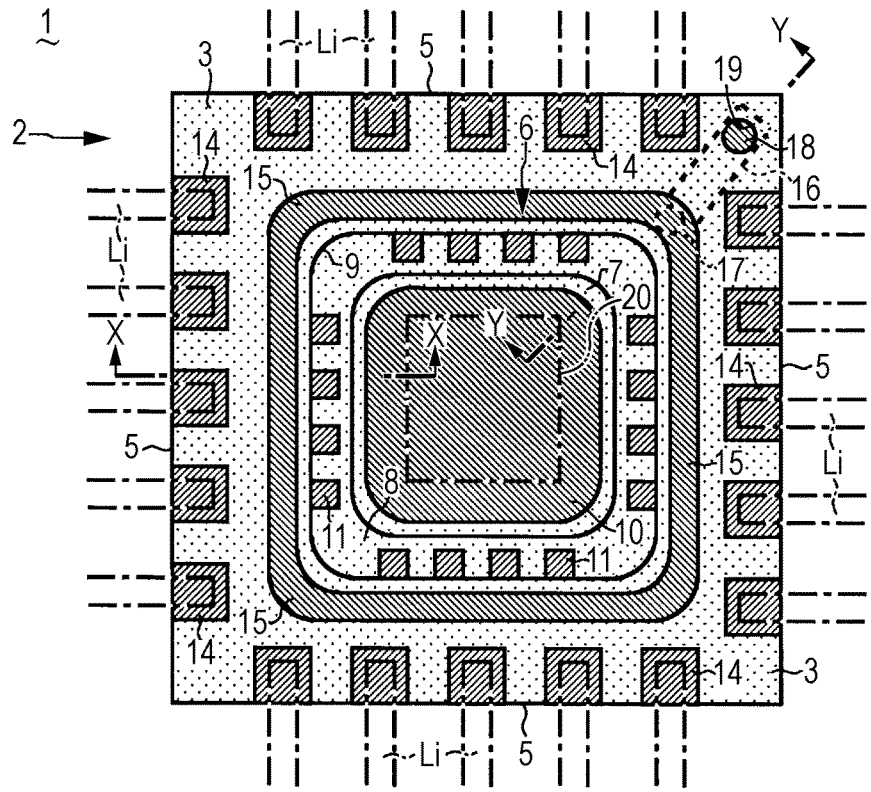
FIG. 1 is a plan view of a Wiring substrate according to an embodiment of the present invention.
Figure 2:
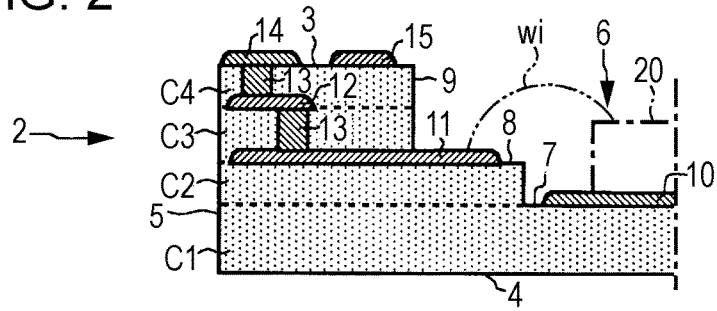
FIG. 2 is a partial vertical sectional view along line X-X in FIG. 1 in the direction of the arrows.
Figure 3:
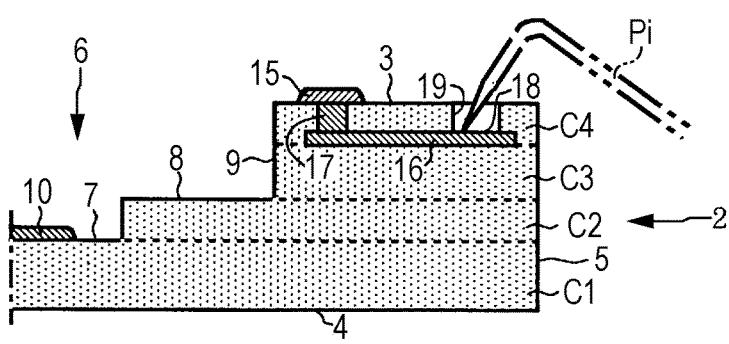
FIG. 3 is a partial vertical sectional view along line Y-Y in FIG. 1 in the direction of the arrows.

FIG. 1 is a plan view of a Wiring substrate 1 according to an embodiment of the present invention. FIG. 2 is a partial sectional view along line X-X in FIG. 1 in the direction of the arrows. FIG. 3 is a partial sectional view along line Y-Y in FIG. 1 in the direction of the arrows.

As shown in FIGS. 1 to 3, the Wiring substrate 1 includes a substrate body 2 having the shape of a plate as a whole, a frame-shaped metalized layer (surface conductor portion) 15 formed on a front surface 3 of the substrate body 2, an electroplating conductor layer 16 formed in the substrate body 2, and a bottomed hole (opening portion) 19 formed near the upper right corner of the front surface 3 of the substrate body 2.

The substrate body 2 has the front surface 3 and a back surface 4 that are square-shaped (rectangular) in plan view, and four side surfaces 5 that are positioned between the peripheral sides of the front surface 3 and the back surface 4. The substrate body 2 is one in which ceramic layers C1 to C4 are integrally laminated upon each other.

The ceramic of the ceramic layers C1 to C4 is a high-temperature fired ceramic, such as alumina, or a low-temperature fired ceramic, such as glass-ceramic.

As shown in FIGS. 1 to 3, a cavity 6 that is square-shaped in plan view opens at a center side in the front surface of the substrate body 2. The cavity 6 is defined by a bottom surface 7 that is square-shaped in plan view, side surfaces 9 that are formed vertically from the peripheral sides of the bottom surface 7 and that have the shape of a quadrangular column as a whole, and a stepped portion 8 that is close to a bottom-surface-7 side of each side wall 9 and that has the shape of a rectangular frame in plan view. A single element mounting pad 10 that is rectangular in plan view is formed on substantially the entire bottom surface 7 excluding the peripheral portions of the bottom surface 7. A semiconductor device 20 and the like are mounted later on a top surface of the element mounting pad 10 with an adhesive.

A plurality of element connection terminals (different conductor portions) 11 are formed on a surface (horizontal surface) of the stepped portion 8. The element connection terminals 11 and the semiconductor device 20 can be electrically conductive with each other through a plurality of bonding wires wi. The frame-shaped metalized layer 15 is formed along the vicinity of an open portion of the cavity 6.

A plurality of external connection conductors (different conductor portions) 14 are formed at the peripheral sides of the front surface 3 of the substrate body 2. One side of each external connection conductor 14 is exposed at its corresponding side surface 5. Each external connection conductor 14 is rectangular in plan view. As shown in FIG. 1, an end portion of each of a plurality of leads Li is later individually joined to its corresponding external connection conductor 14 by, for example, brazing.

Further, as shown in FIG. 2, a portion of each element connection terminal 11 is formed between the ceramic layer C2 and the ceramic layer C3, and a wiring layer 12 is formed between the ceramic layer C3 and the ceramic layer C4. Portions of the element connection terminals 11 and the wiring layer 12 are electrically connected to the external connection conductors 14 through via conductors 13 that individually extend through the ceramic layer C3 or the ceramic layer C4. The remaining portions of the element connection terminals 11 and portions of the external connection conductors 14 may be electrically independent of each other.

In addition, as shown in FIGS. 1 and 3, the bottomed hole 19, which is circular in plan view, opens in the vicinity of the upper right corner of the front surface 3 of the substrate body 2; and a portion (plating electrode surface) 18 at the other end side of the electroplating conductor layer 16, which is formed between the ceramic layer C3 and the ceramic layer C4, is exposed at a bottom surface defining the bottomed hole 19. One end side of the electroplating conductor layer 16 is connected to a via conductor 17 that is connected to a lower surface of the frame-shaped metalized layer 15 in the vicinity of the upper right corner.

Moreover, as shown in FIGS. 1 and 3, the electroplating conductor layer 16 is separated from all of the side surfaces 5 of the substrate body 2 including the upper side surface and the right side surface so as not to be exposed at these side surfaces 5. Further, the electroplating conductor layer 16 is electrically independent of the element connection terminals (different conductor portions) 11 and the external connection conductors (different conductor portions) 14.

The element mounting pad 10, the element connection terminals 11, the wiring layer 12, the via conductors 13, the via conductor 17, the external connection terminals 14, the frame-shaped metalized layer 15, and the electroplating conductor layer 16 are primarily made of, for example, W or Mo or an alloy based on either one of W and Mo when the ceramic forming the ceramic layers C1 to C4 is a high-temperature fired ceramic, such as alumina; and are primarily made of, for example, Cu or Ag or an alloy based on either one of Cu and Ag when the ceramic forming the ceramic layers C1 to C4 is a low-temperature fired ceramic, such as glass-ceramic. The element mounting pad 10, an end side (element-mounting-pad-10 side) of each element connection terminal 11, each external connection conductor 14, the frame-shaped metalized layer 15, and a surface of a portion 18 of the electroplating conductor layer 16 that is exposed to the outside are successively coated with two layers including an Ni plating film and an Au plating film (metal plating films (not shown)), each having a required thickness.

A Wiring substrate 1 such as that described above is generally formed as follows.

For example, four green sheets made of alumina powder are previously provided. After punching required portions of each green sheet, performing pattern printing with conductor paste containing W powder or the like thereon, and filling the through holes, these four green sheets are laminated upon each other and are contact-bonded to each other. Then, the laminated and contact-bonded green sheets are fired to a predetermined temperature zone to form a fired Wiring substrate 1 that is substantially the same as that shown in FIGS. 1 to 3.

Next, as shown by an alternate long and two short dash line in FIG. 3, a pointed end portion of an electrode pin Pi, which is L-shaped as a whole when viewed from a side, is inserted into the bottomed hole 19 from a front-surface-3 side of the substrate body 2, and is brought into point-contact with a surface of the portion 18 of the electroplating conductor layer 16 that is exposed at the bottom surface defining the bottomed hole 19 when a slight pressure is applied. Here, the portion 18 of the conductor layer 16 is a plating electrode surface.

In such a state, the Wiring substrate 1 is, along with the electrode pin Pi, successively immersed in an electrolytic Ni plating bath and an electrolytic Au plating bath (not shown), to successively perform electrolytic Ni plating and electrolytic Au plating. As a result, it is possible to successively coat a surface of the frame-shaped metalized layer 15, which is a surface conductor portion that is not electrically connected to the different conductor layers 11 and the different conductor layers 14, with an Ni plating film and an Au plating film.

A different electrode pin Pi is brought into contact with a surface of the element mounting pad 10 having a relatively wide area. The different electrode pin Pi is brought into contact with either of an end side of each element connection element 11, which is a different conductor portion, and a surface of each external connection conductor 14, which is a different conductor portion, to perform electrolytic metal plating, which is similar to that mentioned above, at the same time that the electrolytic metal plating mentioned above is performed.

As a result of performing these steps described above, a Wiring substrate 1, such as that described above, can be provided.

According to the above-described Wiring substrate 1, through the via conductor 17, the frame-shaped metalized layer 15, which is a surface conductor portion, is electrically connected to an end portion of the electroplating conductor layer 16 whose portion 18 is exposed at the bottomed hole (opening portion) 19 formed in the front surface 3 of the substrate body 2. Therefore, the external connection terminals (different conductor portions) 14 occupy a wide region of the peripheral sides of the front surface 3 of the substrate body 2, and the width and area of the frame-shaped metalized layer are small. Therefore, even if the electrode pin Pi, which is used for electroplating, does not easily directly contact the frame-shaped metalized layer 15, the surface of the frame-shaped metalized layer 15 can be electrically conductive with the electroplating conductor layer 16 through the via conductor 17. Therefore, by inserting the end portion of the electrode pin Pi, which is used for electroplating, from the opening portion of the bottomed hole 19 and bringing the end portion of the electrode pin Pi, which is used for electroplating, into contact with the portion (plating electrode surface) 18 of the electroplating conductor layer 16 that is exposed at the bottomed hole 19, the surface of the frame-shaped metalized layer 15 is reliably covered with metal plating films, that is, an Ni plating film and an Au plating film. Therefore, the Wiring substrate 1 is one in which the surface of the frame-shaped metalized layer 15, which is not electrically conductive with the different conductor portions 11 and 14 when in use, is reliably covered with metallic plating films.

Moreover, since the portion 18 of the electroplating conductor layer 16 is exposed at the bottomed hole 19, it is less likely for the end portion of the electrode pin Pi that is inserted in the bottomed hole 19 to be shifted and dislodged from the bottomed hole 19; and, even if scratches, such as indentations, are produced by the pin Pi, since such scratches are positioned in a bottom portion defining the bottomed hole 19, these scratches are less likely to be conspicuous.

Further, since the electroplating conductor layer 16 is formed in the substrate body 2 and the portion 18 thereof is exposed at the bottom surface defining the bottomed hole 19, it is possible to prevent unintentional short circuits from occurring, and to easily reduce the size of the entire Wiring substrate 1 including the substrate body 2.

Figure 4:
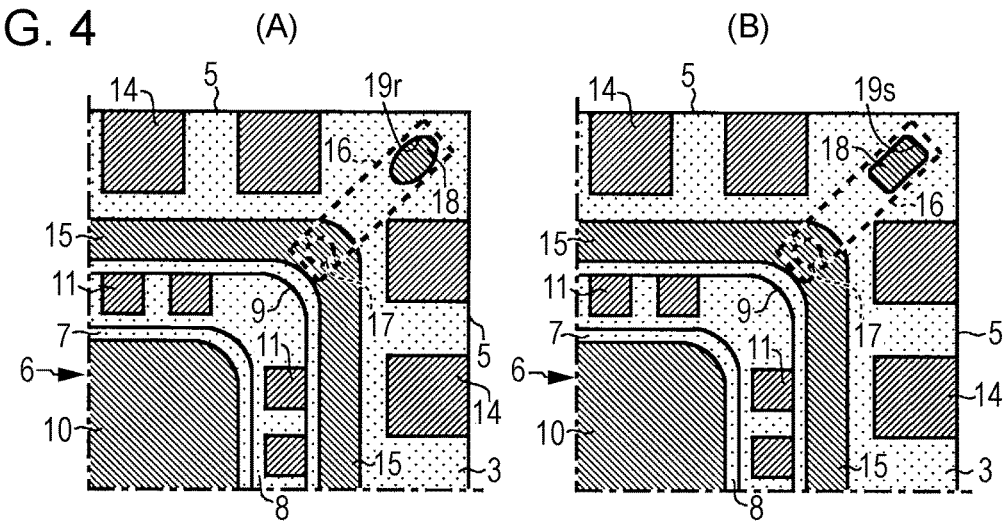
FIG. 4(A) is a partial plan view of the vicinity of a bottomed hole having a different form in the Wiring substrate.
FIG. 4(B) is a partial plan view of the vicinity of a bottomed hole having still another form.

FIG. 4(A) is a partial plan view of the vicinity of a bottomed hole 19r having a different form in the Wiring substrate 1. As shown in FIG. 4(A), in plan view, in the vicinity of one corner of the front surface 3 of the substrate body 2, the bottomed hole 19r has an elliptical shape having a long axis extending along a diagonal passing through a central portion of the front surface 3; and the plating electrode surface (portion) 18 of the electroplating conductor layer 16 is elliptically exposed at a bottom surface defining the bottomed hole 19r. The bottomed hole 19r may have an oblong shape in plan view. The long axis of the bottomed hole 19r in the front surface 3 may extend along any direction.

FIG. 4(B) is a partial plan view of the vicinity of a bottomed hole 19s having still another form in the Wiring substrate 1. As shown in FIG. 4(B), in plan view, in the vicinity of one corner of the front surface 3 of the substrate body 2, the bottomed hole 19s has a rectangular shape having a pair of long sides extending along a diagonal passing through the central portion of the front surface 3, and the plating electrode surface (portion) 18 of the electroplating conductor layer 16 is exposed in a rectangular form at a bottom surface defining the bottomed hole 19s. The bottomed hole 19s may be square-shaped in plan view. Each long side and each side of the bottomed hole 19s in the front surface 3 may extend along any direction.

Figure 5:
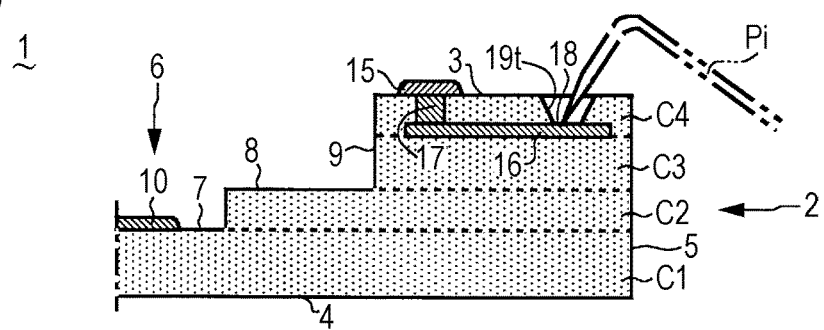
FIG. 5 is a partial vertical sectional view of the vicinity of a bottomed hole having still another form.

Further, FIG. 5 is a partial vertical sectional view of the vicinity of a bottomed hole 19t having still another form in the Wiring substrate 1. As shown in FIG. 5, the bottomed hole 19t is defined by an inclined inner wall surface (tapered surface) that gradually becomes narrower from the front-surface-3 side of the substrate body 2 towards the plating electrode surface (portion) 18 of the electroplating conductor layer 16 that is positioned between the ceramic layer C3 and the ceramic layer C4. Therefore, the bottomed hole 19t has a conical shape when it is circular in plan view, has an elliptical conical shape or a long conical shape when it is elliptical or has an oblong shape in plan view, and has a the shape of a quadrangular prism when it is rectangular or square-shaped in plan view.

Even if any of the bottomed holes 19r to 19t is formed, similar advantages as those provided by the bottomed hole 19 can be provided. In particular, when the bottomed hole 19t that is defined by the inclined inner wall surface is used, as shown in FIG. 5, the end portion of the electrode pin Pi can be easily inserted into the bottomed hole 19t.

Figure 6:
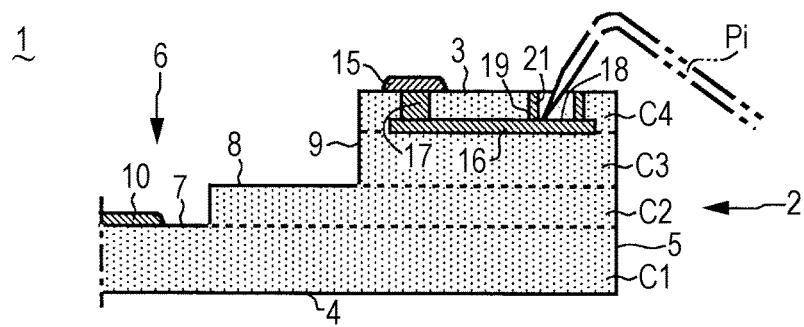
FIG. 6 is a partial vertical sectional view of the vicinity of a bottomed hole that is applied.

FIG. 6 is a partial vertical sectional view of the vicinity of the bottomed hole 19 that is applied in the Wiring substrate 1. As shown in FIG. 6, a circular cylindrical wall surface conductor layer 21 whose bottom surface is connected to the plating electrode surface 18 of the electroplating conductor layer 16, is further formed at an inner wall surface defining the bottomed hole 19 that is circular in plan view. According to the bottomed hole 19 that is provided with such a wall surface conductor layer 21, even if the end portion of the electrode pin Pi is unintentionally dislodged from the plating electrode surface 18, since the end portion of the electrode pin Pi point-contacts an inner peripheral surface of the wall surface conductor layer 21, the electrode pin Pi and the electroplating conductor layer 16 can be electrically connected to each other.

An inner wall surface defining any of the bottomed holes 19r to 19t may also be further provided with the wall surface conductor layer 21.

The bottomed holes 19r to 19t in the Wiring substrate 1 may be formed in any location in the front surface 3 of the substrate body 2. For example, any of the bottomed holes 19r to 19t may be disposed between the external connection terminals 14 and 14 at the peripheral side(s) of the front surface 3.

Figure 7:
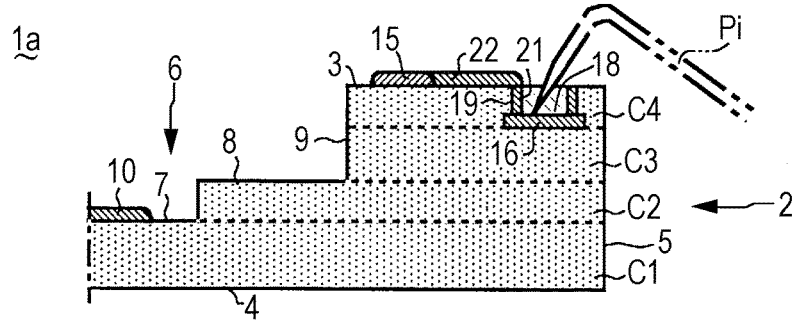
FIG. 7 is a partial vertical sectional view of the vicinity of a bottomed hole in a Wiring substrate according to another embodiment.

FIG. 7 is a partial vertical sectional view of the vicinity of a bottomed hole 19 in a Wiring substrate 1a according to another embodiment.

As shown in FIG. 7, the Wiring substrate 1a similarly includes, for example, a substrate body 2, a cavity 6, a frame-shaped metalized layer 15, and a plurality of external connection terminals 14 (not shown), which are similar to those described above. In the Wiring substrate 1a, the bottomed hole 19, which is similar to that described above, is formed in the vicinity of one corner of or any peripheral side of a front surface 3 of the substrate body 2; a wall surface conductor 21, which is similar to that described above, is formed at an inner wall surface defining the bottomed hole 19; and a plating electrode surface 18 of an electroplating conductor layer 16 is exposed at a bottom surface defining the bottomed hole 19 and the wall surface conductor layer 21. A top surface of the wall surface conductor layer 21 and the frame-shaped metalized layer 15 formed along an open portion of the cavity 6 are electrically connected to each other by a connection wiring 22 formed along the front surface 3 of the substrate body 2. The connection wiring 22 is disposed within a relatively small width so as to extend between the external connection terminals 14 and 14.

The Wiring substrate 1a described above is one that, in addition to the advantages provided by the Wiring substrate 1, provides the advantage of making it possible to, by forming the connection wiring 22 on any location of the front surface 3 of the substrate body 2, such as any location between external connection conductors 14 and 14 that are different conductor portions, minimizing the volume (region) of the inside of the substrate body 2 that is occupied, and reliably cover a surface of the frame-shaped metalized layer 15, which is a surface conductor portion, with required metal plating films.

In place of the bottomed hole 19, any of the bottomed holes 19r to 19s where the wall surface conductor layer 21 is formed at its inner wall surface may be applied.

Even a surface conductor portion (not shown) formed on the back surface 4 of the substrate body 2 can be electrically conductive with the plating electrode surface 18 of the electroplating conductor layer 16 through the bottomed hole 19 that opens at the back surface 4, the wall surface conductor layer 21 formed at the inner wall surface defining the bottomed hole 19, and the connection wiring 22 formed along the back surface 4 so as to be interposed therebetween.

Figure 8:
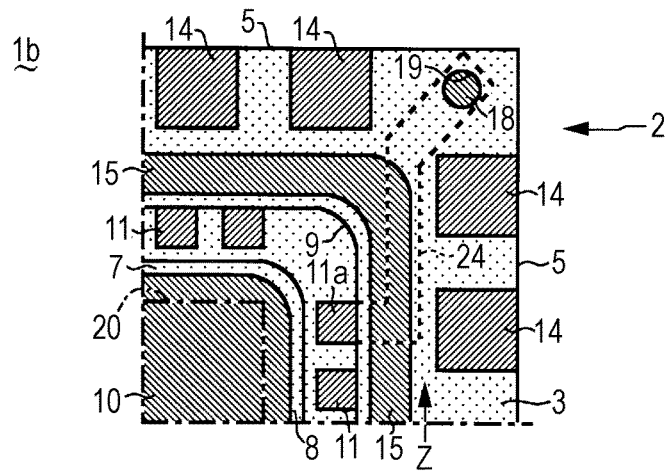
FIG. 8 is a partial plan view of the vicinity of a bottomed hole in a Wiring substrate according to still another embodiment.
Figure 9:
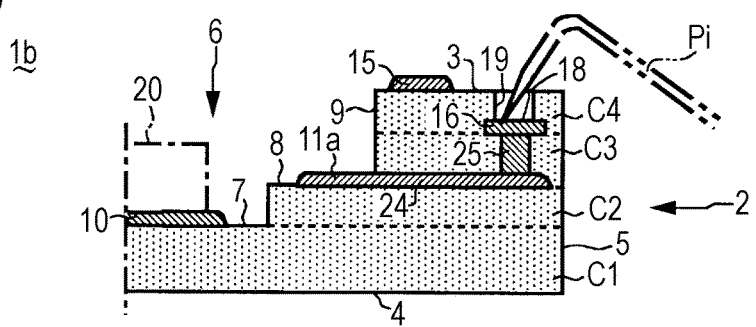
FIG. 9 is a partial vertical sectional view as seen in the direction of arrow Z in FIG. 8.

FIG. 8 is a partial plan view of the vicinity of the bottomed hole 19 in a Wiring substrate 1b according to another embodiment. FIG. 9 is a partial vertical sectional view as seen in the direction of arrow Z in FIG. 8.

As shown in FIGS. 8 and 9, the Wiring substrate 1b includes, for example, a substrate body 2, a cavity 6, a frame-shaped metalized layer 15, and a plurality of external connection conductors 14, which are similar to those described above. In the Wiring substrate 1b, of a plurality of element connection terminals 11 formed on a surface of a stepped portion 8 in the cavity 6, at least one thereof when in use is not electrically connected to the different conductor portions 11 and 14 and a terminal formed on a mother board (not shown), that is, is formed as an electrically independent dummy element connection terminal (surface conductor portion) 11a.

As shown in FIGS. 8 and 9, the bottomed hole 19, which is similar to that described above, is formed in the vicinity of the upper right corner of a front surface 3 of the substrate body 2; and a plating electrode surface 18 of the electroplating conductor layer 16 formed along a portion between a ceramic layer C3 and a ceramic layer C4 is exposed at a bottom surface defining the bottomed hole 19. Even such an electroplating conductor layer 16 is electrically independent of the different conductor portions 11 and 14, and is separated from side surfaces 5 of the substrate body 2.

Further, a base end side of the element connection terminal 11a is connected to one end side of a connection wiring 24 formed between a ceramic layer C2 and the ceramic layer C3. The other end side of the connection wiring 24 is electrically connected to the electroplating conductor layer 16 through a via conductor 25 extending through the ceramic layer C3.

Therefore, as shown in FIG. 9, by bringing an end portion of an electrode pin Pi, which is similar to that described above, into contact with the plating electrode surface (portion) 18 in the bottomed hole 19, and by performing electrolytic Ni plating and electrolytic Au plating, which are similar to those mentioned above, it is possible to reliably cover a surface (exposed surface) of the electrically independent element connection terminal 11a with an Ni plating film and an Au plating film. Consequently, it is possible for the Wiring substrate 1b to be one in which even the surface of the element connection terminal 11a having a relatively small area is covered with predetermined metal plating films.

Figure 10:
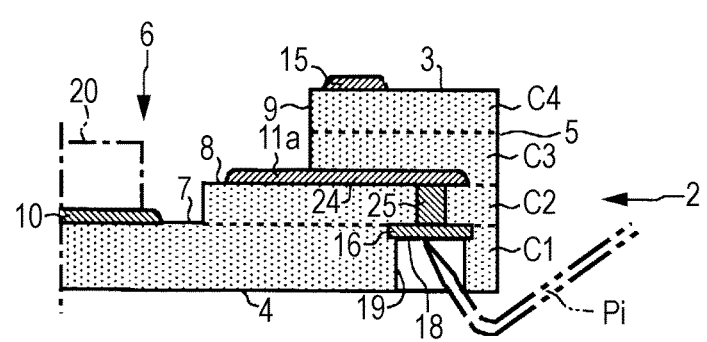
FIG. 10 is a partial vertical sectional view that is similar to FIG. 9 and that illustrates another form of the Wiring substrate.

FIG. 10 is a partial vertical sectional view that illustrates a different form of the Wiring substrate 1b.

As shown in FIG. 10, the Wiring substrate 1b includes, for example, a substrate body 2, a cavity 6, a frame-shaped metalized layer 15, and a plurality of external connection conductors 14 (not shown), which are similar to those described above. An element connection terminal 11a, which is at least one surface conductor portion, is formed on a surface of a stepped portion 8 in the cavity 6. As shown in FIG. 10, a bottomed hole 19 that opens at a back surface 4 of the substrate body 2 is formed in any position at a peripheral side of the back surface 4 so as to extend through a relatively thick ceramic layer C1. A plating electrode surface 18 of an electroplating conductor layer 16 formed between the ceramic layer C1 and a ceramic layer C2 is exposed at a bottom surface defining the bottomed hole 19. Even such an electroplating conductor layer 16 is electrically independent of different conductor portions 11 and the different conductor portions 14, and is separated from side surfaces 5 of the substrate body 2.

Further, when in use, a base end side of the electrically independent element connection terminal 11a is connected to one end side of a connection wiring 24 formed between the ceramic layer C2 and a ceramic layer C3, and the other end side of the connection wiring 24 is electrically connected to the electroplating conductor layer 16 through a via conductor 25 extending through the ceramic layer C2.

Therefore, as shown in FIG. 10, by bringing an end portion of an electrode pin Pi, which is similar to that described above, into contact with the plating electrode surface (portion) 18 in the bottomed hole 19 from a back-surface-4 side of the substrate body 2, and by performing electrolytic Ni plating and electrolytic Au plating, which are similar to those mentioned above, it is possible reliably cover a surface (exposed surface) of the electrically independent element connection terminal 11a with an Ni plating film and an Au plating film.

Figure 11:
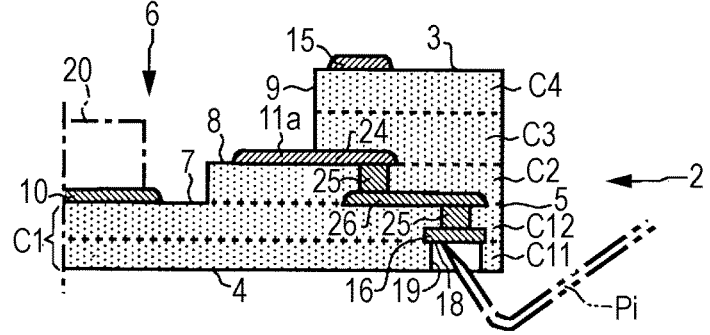
FIG. 11 is a partial vertical sectional view that is similar to FIG. 9 and that illustrates still another form of the Wiring substrate.

FIG. 11 is a partial vertical sectional view that is similar to that above and that illustrates a Wiring substrate 1b that is applied as shown in FIG. 10.

In the Wiring substrate 1b, a relatively thick ceramic layer C1, which is the lowest layer of a substrate body 2, is divided into an upper ceramic layer C11 and a lower ceramic layer C12, a bottomed hole 19 that opens at a back surface 4 of the substrate body 2 is formed, and a plating electrode surface 18 of an electroplating conductor layer 16, which is formed between the ceramic layer C11 and the ceramic layer C12 and which is similar to those described above, is exposed at a bottom surface defining the bottomed hole 19.

Further, a base end side of the element connection terminal 11a, which is a surface conductor portion, is connected to one end side of a connection wiring 24 formed between a ceramic layer C2 and a ceramic layer C3; the other end side of the connection wiring 24 is connected to one end side of a connection wiring 26 through a via conductor 25 extending through the ceramic layer C2, the connection wiring 26 being formed between the ceramic layer C12 and the ceramic layer C2; and the other end side of the connection wiring 26 is electrically connected to the electroplating conductor layer 16 through a via conductor 25 extending through the ceramic layer C12.

As described above, by causing the element connection terminal 11a, which is a surface conductor portion, and the electroplating conductor layer 16 to be electrically conductive with each other through the two layers, that is, the upper connection wiring 24 and the lower connection wiring 26, and two via conductors 25, that is, the upper and lower via conductors 25, the bottomed hole 19 having a relatively small inside diameter easily opens at the back surface 4 of the substrate body 2.

Even the Wiring substrate 1b having such a form described above becomes one in which a surface of the element connection terminal 11a having a relatively small area is covered with predetermined metal plating films.

In the forms of the Wiring substrates 1b shown in FIGS. 9 to 11, in place of the bottomed hole 19, any one of the bottomed holes 19r to 19s may be formed. The wall surface conductor layer 21 may be formed on the inner wall surface of any one of such bottomed holes 19 and 19r to 19s.

In each of the forms of the Wiring substrates 1b shown in FIGS. 8 to 11, it is possible to form, in place of the single element mounting pad 10, a plurality of element mounting pads on the bottom surface 7 defining the cavity 6; form a portion of each element mounting pad as an electrically independent surface conductor portion when in use; and cover surfaces of the element mounting pads, which are the surface conductor portions, with predetermined metal plating films by any of the ways shown in FIGS. 8 to 11.

The present invention is not limited to the embodiments and forms described above.

For example, the front surface of the substrate body may be a flat surface, or a cavity, which is similar to that described above, may open in a reverse direction in the back surface of the substrate body.

The surface conductor portion according to the present invention also refers to a portion of an external connection conductor formed at any location on the front surface or the back surface of the ceramic substrate body. For example, the external connection terminals refer to, in addition to a plurality of external connection conductors that are different conductor portions, those that form portions of a certain pattern to be subjected to image recognition on the front surface or the back surface in plan view; and positioning alignment marks on the front surface or the back surface of the substrate body in plan view.

Further, it is possible to form a plurality of the bottomed holes, which are opening portions according to the present invention, in the front surface or the back surface of the same Wiring substrate, and individually expose portions of the electroplating conductor layer at the bottom surfaces defining the respective bottomed holes.

In addition, the bottomed hole may have a small opening diameter at the front surface or the back surface of the substrate body, and may have a wide bottom in cross section in which the diameter of a bottom-surface side is larger than the opening diameter.

INDUSTRIAL APPLICABILITY

According to the present invention, it is possible to reliably provide a Wiring substrate in which, even if, for example, the front surface of the ceramic substrate body is provided with an electrically independent surface conductor portion, or even if the bottom-surface side of the cavity that opens at the front surface of the substrate body is provided with an electrically independent surface conductor portion, a surface of each of these surface conductor portions is reliably covered with metal plating films; scratches on these surfaces caused by contact with an electrode pin are less likely to be conspicuous; and the substrate body can be reduced in size.

REFERENCE SIGNS LIST 1, 1a, 1b Wiring substrate
2 substrate body
3 front surface
4 back surface
5 side surface
11 element connection terminal (different conductor portion)
11a element connection terminal (surface conductor portion)
13, 25 via conductor
14 external connection conductor (different conductor)
15 frame-shaped metalized layer (surface conductor portion)
16 electroplating conductor layer
18 plating electrode surface (portion)
19, 19r to 19t bottomed hole (opening portion)
21 wall surface conductor layer
22 connection wiring
c1~c4 ceramic layer (ceramic)

The invention claimed is:

1. A Wiring substrate comprising:
a substrate body that is formed from ceramic, the substrate body including a front surface, a back surface, and side surfaces positioned between the front surface and the back surface;
a surface conductor portion that is formed on at least one of the front surface or the back surface of the substrate body, a surface of the surface conductor portion being covered with a metal plating film; and
an electroplating conductor layer that is formed in the substrate body, an end of the electroplating conductor layer being electrically connected to the surface conductor portion, the other end of the electroplating conductor layer being formed at the front surface or the back surface of the substrate body, the other end of the electroplating conductor layer being electrically independent of a different conductor portion that differs from the surface conductor portion, the electroplating conductor layer being separated from the side surfaces of the substrate body,
wherein an opening portion for exposing at least a portion of the electroplating conductor layer is formed in at least one of the front surface or the back surface of the substrate body.

2. The Wiring substrate according to claim 1, wherein the surface conductor portion is a frame-shaped metalized layer for sealing a cavity that opens at the front surface of the substrate body, the frame-shaped metalized layer being formed along an opening portion of the cavity, or is a portion of an external connection conductor that is formed on the front surface or the back surface of the substrate body.

3. The Wiring substrate according to claim 1, wherein the substrate body has a cavity that opens at the front surface thereof, and a non-conducting pad is formed at a bottom-surface side of the cavity, the non-conducting pad being the surface conductor portion.

4. The Wiring substrate according to claim 1, wherein the surface conductor portion and the electroplating conductor layer are capable of being electrically conductive with each other through at least one of a via conductor or a connection wiring.

5. The Wiring substrate according to claim 1, wherein the opening portion is a bottomed hole, and a portion of the electroplating conductor layer is exposed at a bottom surface defining the bottomed hole.

6. The Wiring substrate according to claim 5, wherein a wall surface conductor layer that is electrically connected to the electroplating conductor layer is formed at an inner wall surface defining the bottomed hole.

7. The Wiring substrate according to claim 6, wherein the surface conductor portion and the electroplating conductor layer are electrically connected to each other through the wall surface conductor layer and the connection wiring formed on the front surface or the back surface of the substrate body.

\* \* \* \* \*